(12) United States Patent
Borghetti et al.

(10) Patent No.: US 8,451,644 B2
(45) Date of Patent: May 28, 2013

(54) NON-VOLATILE SAMPLER

(75) Inventors: Julien Borghetti, Mountain View, CA (US); David A. Fattal, Mountain View, CA (US); John Paul Strachan, Millbrae, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 253 days.

(21) Appl. No.: 12/825,607

(22) Filed: Jun. 29, 2010

(65) Prior Publication Data

US 2011/0317469 A1 Dec. 29, 2011

(51) Int. Cl.
*G11C 11/00* (2006.01)
*H01L 21/82* (2006.01)

(52) U.S. Cl.
USPC ....... 365/148; 365/207; 365/189.07; 438/129

(58) Field of Classification Search
USPC .................. 365/148, 207, 189.07; 438/129
See application file for complete search history.

(56) References Cited

U.S. PATENT DOCUMENTS

| | | | |
|---|---|---|---|
| 7,366,942 B2 | 4/2008 | Lee | |
| 2001/0009440 A1* | 7/2001 | Yang et al. | 348/294 |
| 2006/0044878 A1* | 3/2006 | Perner | 365/189.01 |
| 2008/0310236 A1 | 12/2008 | Jacob | |
| 2011/0286259 A1* | 11/2011 | Perner | 365/148 |

OTHER PUBLICATIONS

Witrisal, K.; "Memristor-Based Stored-Reference Receiver—the UWB Solution"; vol. 45; Jul. 2, 2009; http://www.spsc.tugraz.at/people/klaus/WitrisalEL09.pdf.
Pershin, Yuriy V. et al.; "Practical Approach to Programmable Analog Circuits with Memristors"; http://arxiv.org/PS_cache/arxiv/pdf/0908/0908.3162v2.pdf, Date: Jan. 17, 2010.
Guo-Ruey, Tsai et al.; "High Speed Signal Sampler by Multiple-Path Algorithm"; Nov. 21-24, 2004; pp. 29-31; vol. 1; http://ieeexplore.ieee.org/Xplore/login.jsp?url=http://ieeexplore.ieee.org/iel5/9709/30646/01414348.pdf%3Famumber%3D1414348&authDecision=-203.

* cited by examiner

*Primary Examiner* — Toan Le
*Assistant Examiner* — Hai Pham

(57) ABSTRACT

A non-volatile sampler including a row line for receiving an input signal to be sampled, the row line intersecting a number of column lines, non-volatile storage elements being disposed at intersections between the row line and the column lines; a bias voltage source connected to the column lines, the bias voltage source for selectively applying a bias voltage to at least one of the non-volatile storage elements to cause the at least one of the storage elements to store a sample of the input signal at the instance the bias voltage is applied.

20 Claims, 8 Drawing Sheets

NON-VOLATILE SAMPLER

BACKGROUND

Physical computing systems and other electronic devices often make use of both volatile and non-volatile types of memory. Volatile memory loses its data when power is no longer being supplied. Non-volatile memory can still retain data even when the power supply has been deactivated or disconnected. However, volatile types of memory are able to operate at much faster rates. Particularly, data can be written to a volatile memory device much faster than it can be written to a non-volatile memory device.

One type of electronic device which makes use of both volatile and non-volatile memory is a sampling system. A sampling system receives a signal from a sensor in an analog format. An analog signal is a time varying signal that can assume any continuous value. This is opposed to a digital signal which can only assume a discrete set of values. A typical sampling system uses an Analog-to-Digital Converter (ADC) to place the received analog signal into a digital form. This digital data can then be stored onto a non-volatile memory device. However, many types of sampling systems sample data at a rate higher than can be written to typical non-volatile memory devices. Consequently, sampling systems typically require use of a high speed volatile type of memory to act as a buffer. The use of both the ADC and the high speed volatile memory add to the cost and size requirements of the sampling system.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

Figure 1A:
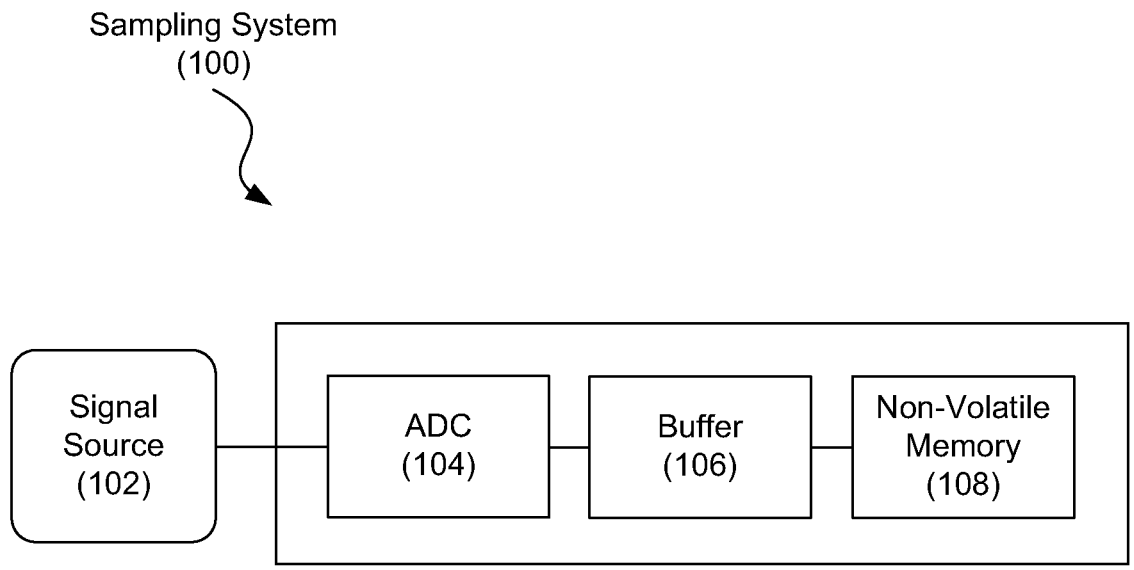
FIGS. 1A and 1B are diagrams showing illustrative components of a sampling system, according to one example of principles described herein.

As mentioned above, one type of electronic device which makes use of both volatile and non-volatile memory is a sampling system. A sampling system receives a signal from a sensor in an analog form. An analog signal is a time varying signal that can assume any continuous value. This is opposed to a digital signal which can only assume a discrete set of values, usually ones and zeros that can be organized into digital "words" that represent any desired value.

A typical sampling system uses an Analog-to-Digital Converter (ADC) to place the received analog signal into a digital form. This digital data can then be stored in a non-volatile memory device. However, many types of sampling systems sample data at a higher rate than can be written to typical non-volatile memory devices. Consequently, sampling systems typically require use of a high speed volatile type of memory to act as a buffer. The use of both the ADC and the high speed volatile memory buffer add to the cost and size requirements of the sampling system.

One type of non-volatile memory structure is a crossbar memory array. A crossbar memory array includes a first set of parallel lines intersecting a second set of parallel wire lines. For purposes of illustration, one of these sets of parallel lines will be referred to as row lines, and the other set of lines will be referred to as column lines. However, the term row line or column line does not imply any specific orientation.

In a crossbar memory array, storage elements are placed at intersections between row lines and column lines. One type of storage element which can be used is a memristive device. A memristive device will maintain its resistive value until a programming condition is applied. A programming condition can be a voltage above a threshold voltage. Voltages under the threshold voltage will have a negligible effect on the resistance of a memristive memory element. However, voltages above the threshold voltage will cause a change in the resistance value of the memristive device. The degree of change is dependent upon the voltage value and the duration of time which that voltage is applied.

Storage elements such as memristive devices can be used to store data in a digital format. For example, a high resistive state can represent a digital '0' and a low resistive state can represent a digital '1'. Alternatively, memristive devices can be used to store an analog representation of an analog signal. Memristive devices may assume any resistive value between the high resistive state and the low resistive state. Thus, the resistive value of a memristive device can be used to represent the instantaneous value of a sampled analog signal over a range of values.

The present specification relates to a method and system for using a crossbar memory array to sample an analog signal. According to certain illustrative examples, a number of non-volatile storage elements are placed along a row line. Each non-volatile storage element is also connected to one of a set of column lines running perpendicular to the row line. Although various types of non-volatile storage elements can be used in a sampler embodying principles described herein, this specification will give a description using the example of a memristive device.

As the row line receives an input signal, bias voltages can be selectively applied to the column lines. The bias voltage can be such that the voltage drop across the memristive device is above the threshold voltage for changing the state of a memristive device. Additionally, the voltage drop across the memristive device will be dependent on the value of the input signal at the instant which the bias voltage is applied to one of the column lines. Thus, a sample of the input signal at the time in which a bias voltage is applied to a column line connected to a memristive device is stored in that memristive device.

Through use of a sampling system embodying principles described herein. Sampled data can be stored directly to a non-volatile storage element without the need for an ADC or an additional memory to be used as a buffer. Certain non-volatile storage elements such as memristive devices are able to switch at high speeds, thus a sampling system using such high speed devices can be used to store data which has been sampled at high resolution. Additionally, memristive devices are relatively small. Thus, they can store a high volume of data while using little space.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Throughout this specification and in the appended claims, the term "non-volatile storage element" is to be broadly interpreted as a device which is able to switch its resistance state to store data. This data is retained with or without power. A non-volatile storage element, as defined here, can store data in both analog and digital form. One example of a non-volatile storage element is a memristive device. Additional examples include devices based on phase change materials and magnetic-based devices such as spin-transfer torque memory.

Figure 1B:
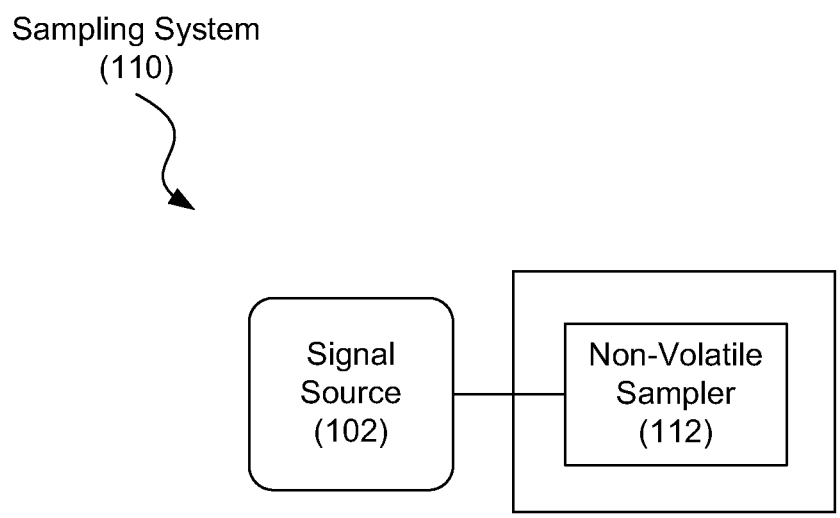

Referring now to the figures, FIGS. 1A and 1B are diagrams showing illustrative components of sampling systems (100, 110). FIG. 1A illustrates a typical sampling system (100). As mentioned above, a typical sampling system (100) includes an ADC (104), a buffer (106) and a non-volatile memory device (108).

The ADC (104) receives an analog signal from a signal source (102) such as a sensor and converts that analog signal into a digital signal. The sensor may be, for example, a light sensor on a camera, or an acoustic wave sensor such as a microphone. The ADC (104) then sends the digitized signal to a buffer (106).

The buffer (106) is a high speed memory device that is able to be written to at high rates. This allows the analog signal from the sensor to be sampled at high rates. However, to be able to write at high speeds, the buffer (106) is typically made of a volatile type of memory. Thus, the data stored in the buffer (106) is transferred to a non-volatile memory storage device (108) so that the data can be retained even when power is no longer being supplied.

FIG. 1B is a diagram of a sampling system (110) embodying principles described herein. As mentioned above, a crossbar memory array may act as a non-volatile sampler (112). This eliminates the need for a separate ADC (104) circuit and a buffer (106).

Figure 2:
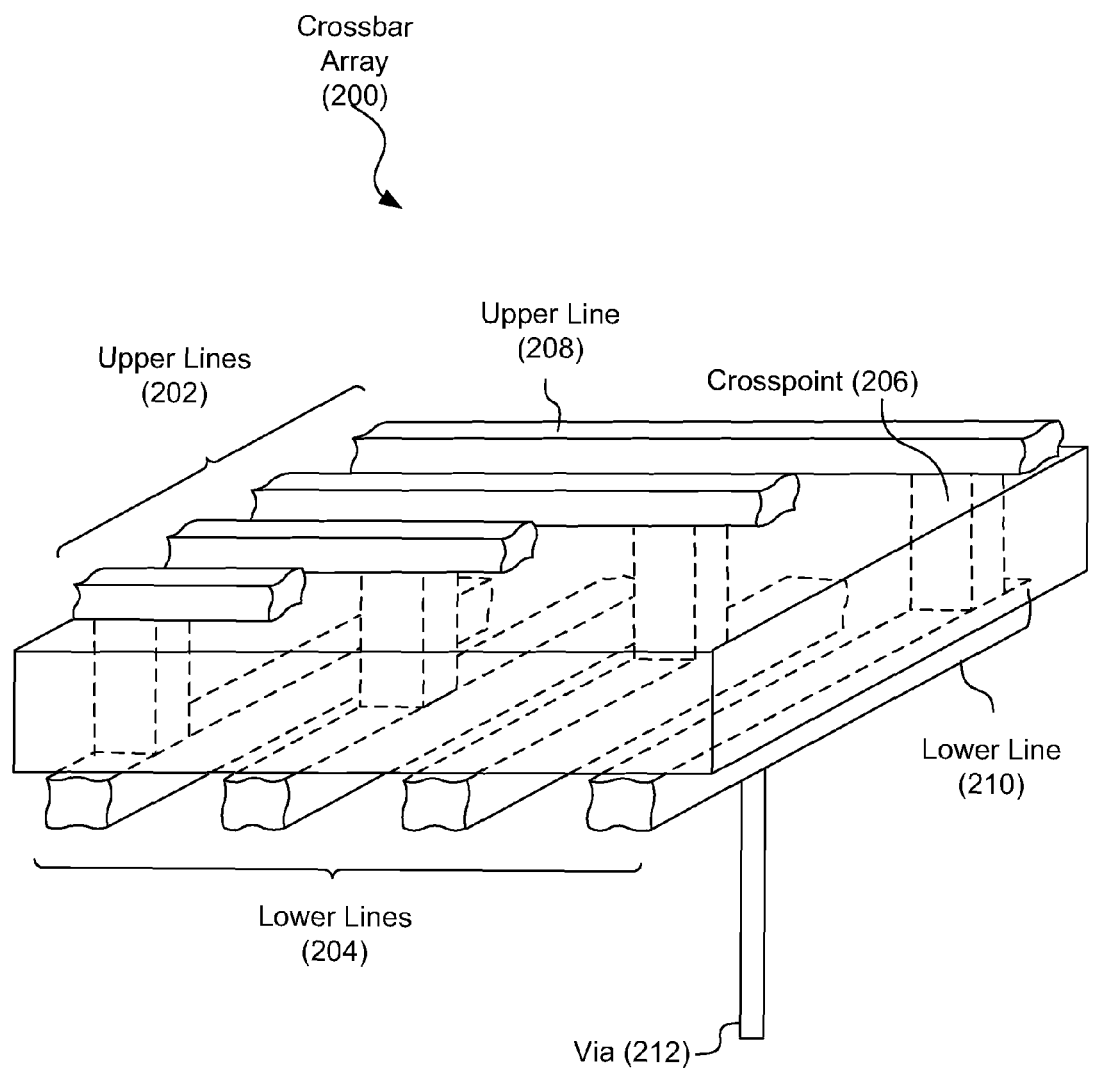
FIG. 2 is a diagram of an illustrative crossbar array, according to one example of principles described herein.

FIG. 2 is a diagram showing an illustrative crossbar memory array (200). According to certain illustrative examples, the crossbar memory array (200) may include an upper set of upper lines (202) which may generally be in parallel. Additionally, a lower set of lines (204) is generally perpendicular to, and intersects, the upper lines (202). Programmable crosspoint or memory devices (206) are formed at the intersections between an upper line (208) and a lower line (210).

According to certain illustrative examples, the programmable crosspoint devices (206) may be memristive devices or other non-volatile storage elements as defined above. Memristive devices exhibit a "memory" of past electrical conditions. For example, a memristive device may include a matrix material that contains mobile dopants. These dopants can be moved within a matrix to dynamically alter the electrical operation of an electrical device, such as the resistance of that device.

The motion of dopants can be induced by the application of a programming condition such as an applied electrical voltage across a suitable matrix. The programming voltage generates a relatively high electrical field through the memristive matrix and alters the distribution of dopants. After removal of the electrical field, the location and characteristics of the dopants remain stable until the application of another programming electrical field.

As indicated, by changing the dopant configurations within a memristive matrix, the electrical resistance of the device may be altered. The memristive device is then read by applying a lower reading voltage which allows the internal electrical resistance of the memristive device to be sensed but does not generate a high enough electrical field to cause significant dopant motion. Consequently, the state of the memristive device may remain stable over long time periods and through multiple read cycles.

According to certain illustrative examples, the crossbar memory array (200) may be used to form a non-volatile memory array. As noted above, non-volatile memory has the characteristic of not losing its contents when no power is being supplied. Each of the programmable crosspoint devices (206) is used to represent one or more bits of data. Although individual crossbar lines (208, 210) in FIG. 2 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar memory array (200) may be integrated into a Complimentary Metal-Oxide-Semiconductor (CMOS) circuit or other conventional computer circuitry. Each individual wire segment may be connected to the CMOS circuitry by a via (212). The via (212) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 3A:
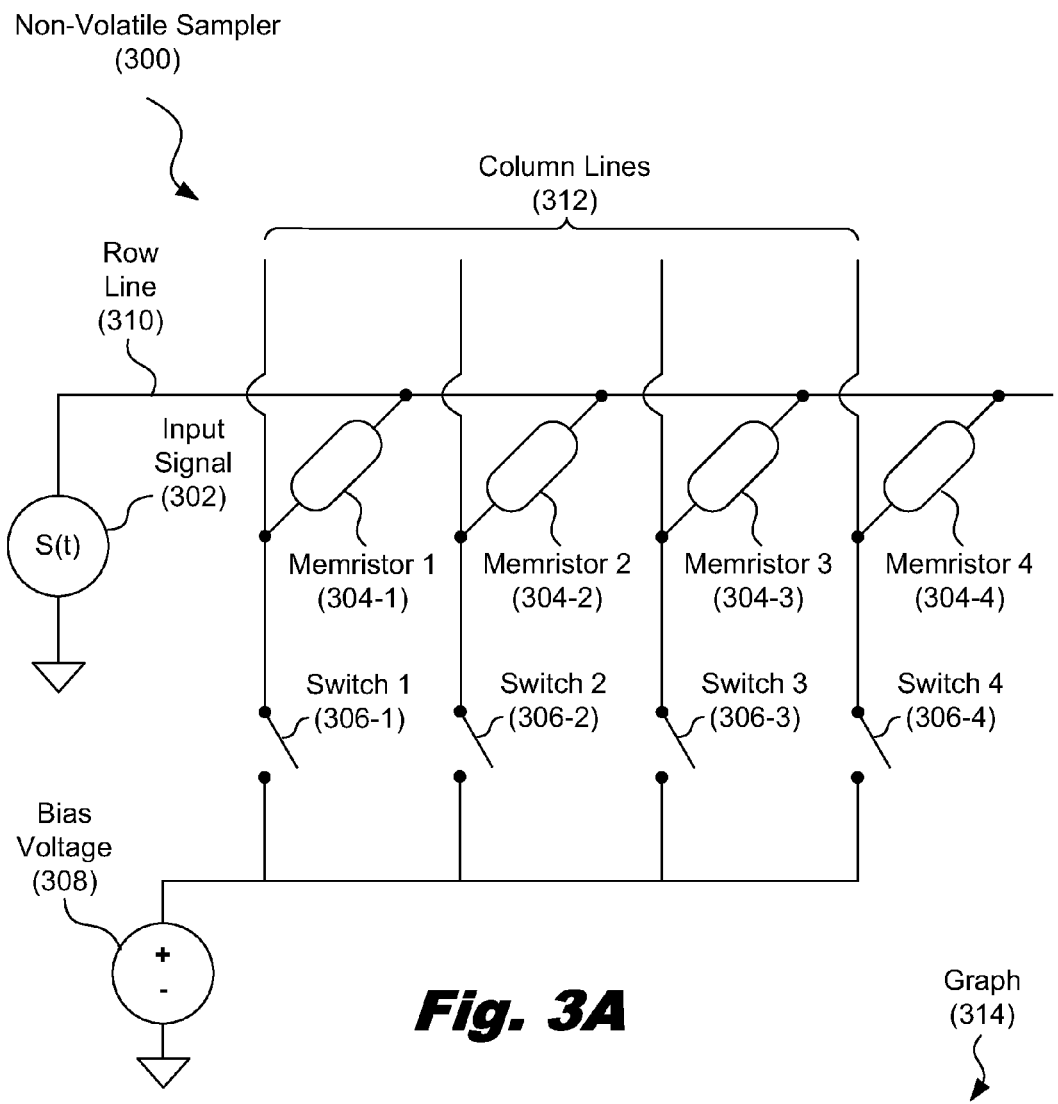
FIG. 3A is a diagram showing an illustrative high speed non-volatile memory device, according to one example of principles described herein.

FIG. 3A is a diagram showing an illustrative high speed non-volatile sampler (300). According to certain illustrative examples, a row line (310) receives an input signal (302) from a signal source. The input signal (302) can be in the form of a voltage. The input signal (302) can also be scaled so that at its highest value, it is still not greater than the threshold voltage required to change the resistive state of the memristors (304) along the row line (310). The following describes the manner in which a representation of the input signal (302) is sampled and stored in the memristors (304).

During normal operation, the time-varying input signal (302) is applied to one terminal of each of the memristors (304) along the row line (310). However, because the amplitude of the signal is smaller than the threshold voltages required to change the resistive state of the memristors, the memristors remain unaffected. Additionally, all switches (306) connecting the bias voltage (308) to the memristors (304) are in an open position.

At a first sampling instant, switch 1 (306-1) is closed. When switch 1 is closed, the bias voltage (308) is applied to a terminal of memristor 1 (304-1). The voltage across memristor 1 (304-1) at this sampling instant will be the difference in voltage between the bias voltage (308) and the voltage value of the input signal (302) at this sampling instant. The bias voltage (308) is of a value such that it is above the threshold voltage required to change the state of the memristors (304). Thus, the difference between the bias voltage (308) and any possible value of the input signal (302) will cause memristor 1 (304-1) to change its resistive value. The newly assumed resistive value of memristor 1 (304-1) is dependent upon the signal value of the input signal (302) at the instant which the bias voltage was applied to the column line (312) connected to memristor 1 (304-1). Thus, the newly assumed resistive value of memristor 1 (304-1) is representative of the input signal (302) value at this sampling instant.

During subsequent sampling instants, switch 2 (306-2) is opened to store a value of the input signal in memristor 2 (304-2), switch 3 (306-3) is opened to store a value of the input signal in memristor 3 (304-3), and switch 4 (306-4) is opened to store a value of the input signal in memristor 4 (304-4).

Although FIG. 3A only illustrates four memristors along the row line (310), a practical non-volatile sampler (300) may have a greater number of memristors along a row line (310). Additionally, a non-volatile sampler (300) can have multiple row lines (310) intersecting the column lines (312). The input signal (302) can then be switched between the multiple row lines (310).

Figure 3B:
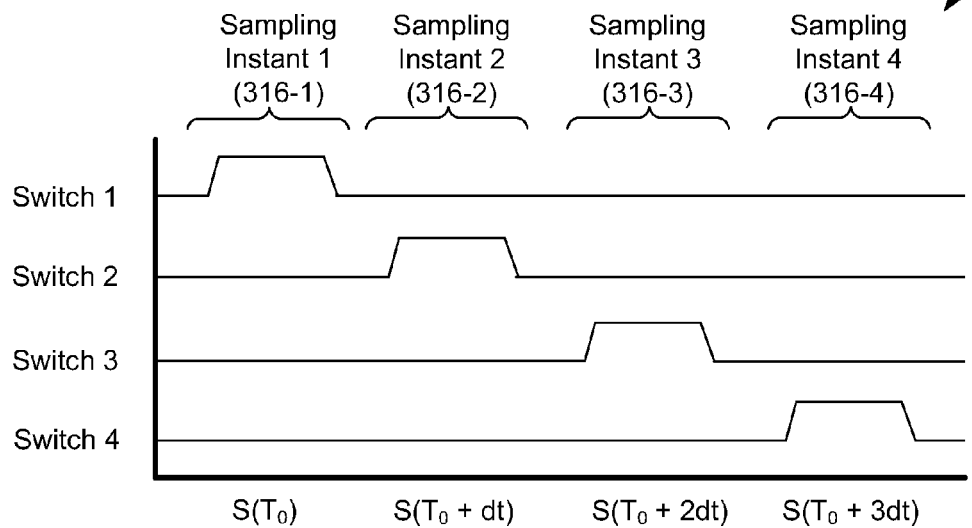
FIG. 3B is a diagram showing an illustrative graph of clock signal timing for the memory device of FIG. 3A, according to one example of principles described herein.

FIG. 3B is a diagram showing an illustrative graph (314) of clock signal timing for the memory device of FIG. 3A. The graph (314) illustrates the timing signals for switch 1 (306-1), switch 2 (306-2), switch 3 (306-3), and switch 4 (306-4). The horizontal axis represents time. The clock signal controls when a switch is open or closed. In this example, when the clock signal is high, the switch is open. Conversely, when the clock signal is low, the switch is closed.

At sampling instant 1 (316-1), the clock signal for switch 1 (306-1) goes high for a short duration of time. This places switch 1 (306-1) in an open position for a short duration of time. During this time, the bias voltage is applied to memristor 1 (304-1), causing memristor 1 (304-1) to store the value of the input signal at sampling instant 1 (316-1). This same process occurs at sampling instant 2 (316-2), sampling instant 3 (316-3) and sampling instant 4 (316-4).

Figure 4:
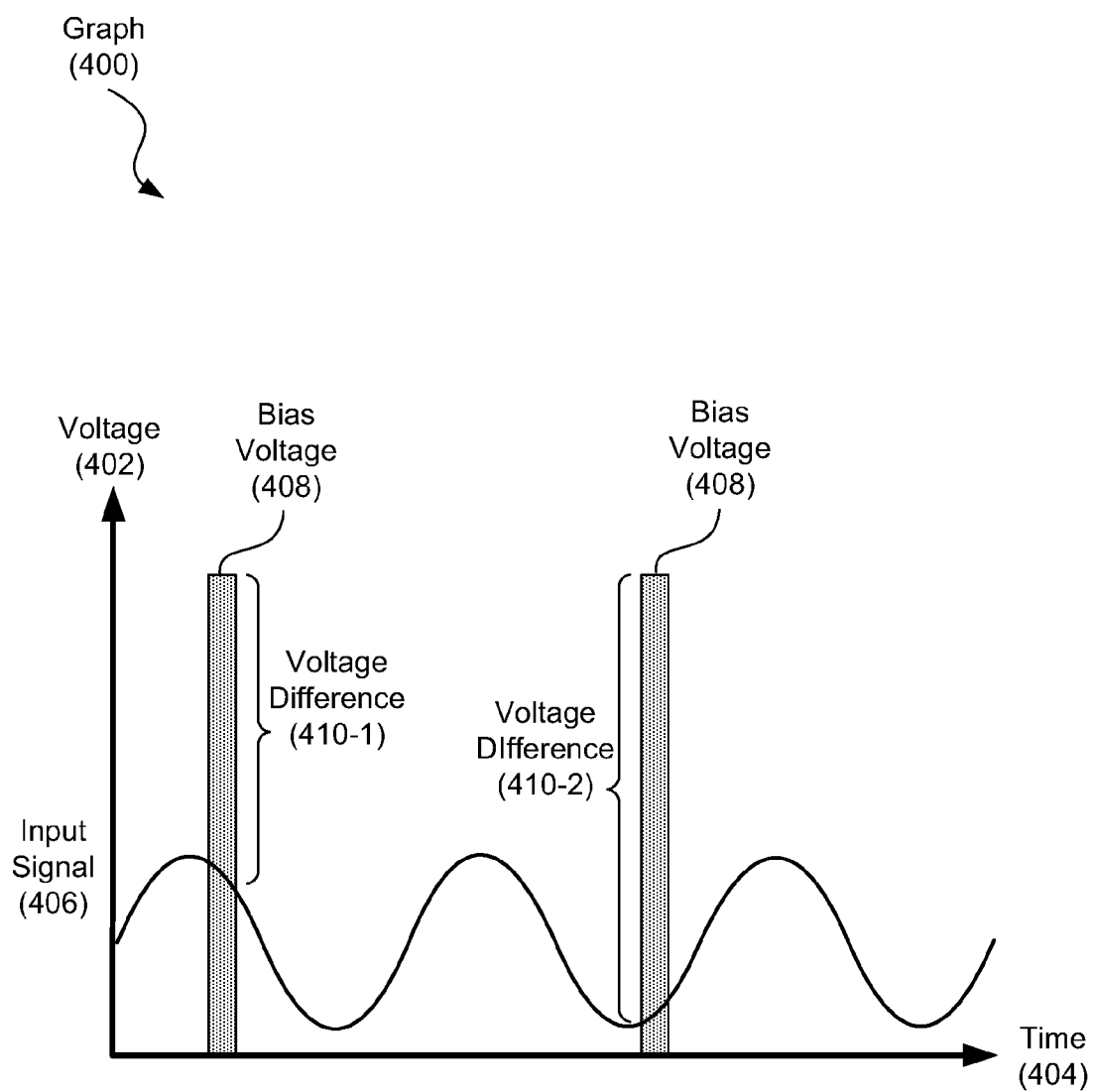
FIG. 4 is a diagram showing an illustrative graph of a relationship between an input signal and bias voltages, according to one example of principles described herein.

FIG. 4 is a diagram showing an illustrative graph (400) of a relationship between an input signal (402) and a bias voltage (408). The vertical axis of the graph (400) represents voltage (402) and the horizontal axis of the graph (400) represents time (404). The input signal (406) is shown as having a varying voltage value over time.

According to certain illustrative examples, the bias voltage (408) is a positive voltage. The positive bias voltage (408) is such that the smallest difference between the input signal (406) and the bias voltage is larger than the threshold voltage of the memristors. At one sampling instant, when the input signal (406) is near its peak, the voltage difference (410-1) is relatively small. However, it will still be above the threshold voltage and will therefore change the state of the memristor. In a different sampling instant, when the input signal (406) is near its bottom, the voltage difference (410-2) is relatively large. In some examples, the bias voltages (408) may be negative voltages. The voltage across the memristor will still be the difference between the input signal (406) and the negative bias voltage at the instant which the negative bias voltage is applied to the memristor.

Storing a sample of an analog value in an analog manner allows data to be sampled at high rates. This is because an ADC is not used to convert the analog signal into a digital signal. However, in some cases, it can be beneficial to use digitized representations of signals. Consequently, in some examples, the non-volatile sampler can act as an ADC and store samples of the received input signal as a digitized representation of the input signal.

Figure 5:
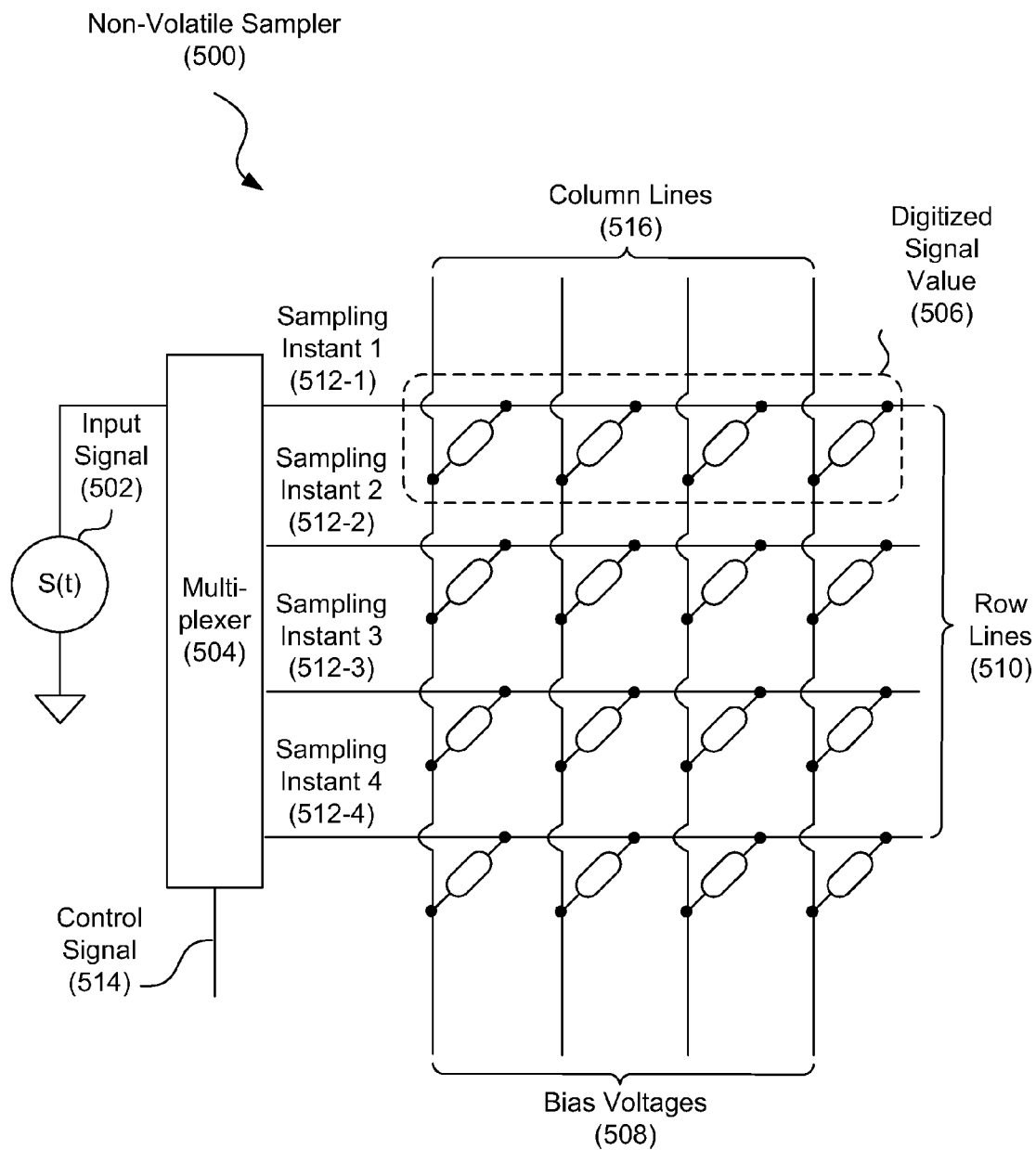
FIG. 5 is a diagram showing an illustrative high speed non-volatile memory device able to store digitized values, according to one example of principles described herein.

FIG. 5 is a diagram showing an illustrative high speed non-volatile sampler (500) able to store digitized values. According to certain illustrative examples, a set of memristors along a particular row line (510) of a memristive crossbar array can be used to store a digital value (506) of a sample of an input signal (502). Each row line (510) in the array can be used to store a sample of the input signal (502) at a different instant. In the example of FIG. 5, four row lines (510) are used to store four 4-bit samples of the input signal. The following will describe the basic operation of such a non-volatile sampler.

The input signal (502) is received into a multiplexer (504). A multiplexer (504) is a digital circuit designed to receive one input and switch that input to one of several outputs based on a control signal. The control signal can be designed so that it causes the multiplexer (504) to switch the input signal to each of the outputs in succeeding time intervals. This procedure is often referred to as time multiplexing.

At each sampling instant (512), when the input signal is being applied to a particular row line (510), a different bias voltage (508) is applied to each of the column lines (516). The different bias voltages (508) can be designed so that based on the value of the sampled input signal, the different memristive devices will be either change or be left unaltered. For example, if the input signal (502) at a particular instant when combined with a bias voltage (508) is larger than the threshold voltage, then the memristive device will change. The set of memristors along a given row line can then be a digital representation of the sampled input signal.

Figure 6:
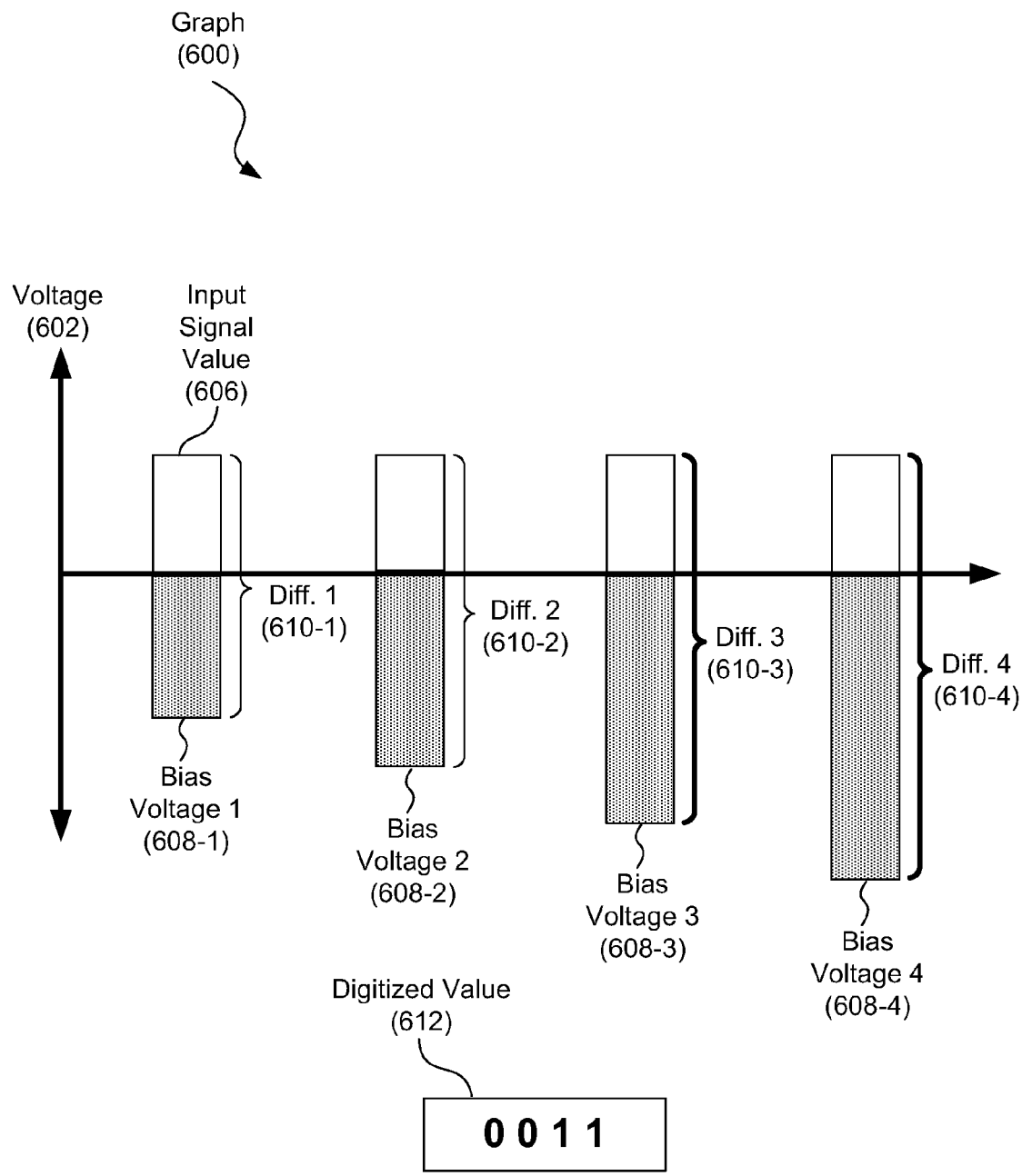
FIG. 6 is a diagram showing an illustrative graph of a relationship between an input signal and different bias voltages, according to one example of principles described herein.

FIG. 6 is a diagram showing an illustrative graph of a relationship between an input signal and different bias voltages. There are many ways in which the bias voltages of each of the column lines may be set to specific levels in order to digitally encode a sample of the input signal. One way is to use thermometer coding.

Thermometer coding is such that the value represented by a number of bits is equal to the number of bits in the ON state. For example, a 4-bit thermometer coded value can assume 5 discrete values; 0, 1, 2, 3 and 4. If none of the bits are in an ON state, then the value represented is zero. If all four of the bits are in an ON state, then the value represented is four. The memristive devices along a row line can be used to represent an ON or OFF state based on their resistive values. For example, a high resistive value can represent an OFF state and a low resistive value can represent an ON state.

When sampling a signal with a non-volatile sampler (e.g. 500, FIG. 5), each of the memristors may be initially set to a high resistive state. If the applied bias voltage applied to a particular memristive device along the row line is large enough to change the resistive value of that memristive device, then that memristive device is set to a low resistive state.

In one example, a given input signal value (606) is applied to a row line having four memristors attached. Each of the memristors is attached to a different column line having a different bias voltage (608) being applied. As mentioned above, the bias voltages (608) can be negative. The difference (610-1) between the positive signal value (606) and the first bias voltage (608-1) applied to a first memristor is not enough to change the value of the first memristor. Thus, the first memristor remains in a high resistive state, representing a digital '0'. Similarly, a second memristor has a slightly higher bias voltage (608-2) applied. The difference (610-2) between this bias voltage (608-2) and the input signal value (606) may still not be enough to change the state of the second memristor. However, the third memristor has a bias voltage (608-2) applied which is large enough to cause the difference (610-3) between this bias voltage (608-3) and the input signal value (606) to exceed the threshold voltage and change the state of the third memristor to a low resistive state. Thus, the third memristor may represent a digital '1'. Similarly, the fourth memristor having an even bigger bias voltage (608-4) applied will have a difference (610-4) significant enough to change the state of the fourth memristor to represent a digital '1'. The final digitized value (612) for this example would then be "0011".

The manner described above for storing a digitized signal in a non-volatile sampler is merely one way of doing so. As will be appreciated by those skilled in the art, other ways of encoding the digitized value by using different bias voltages applied to different column lines can be used.

Figure 7A:
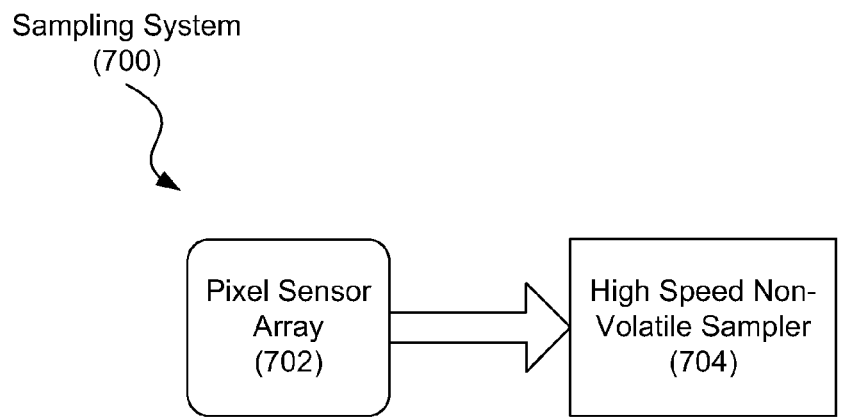
FIGS. 7A and 7B are diagrams showing an illustrative sampling system, according to one example of principles described herein.
Figure 7B:
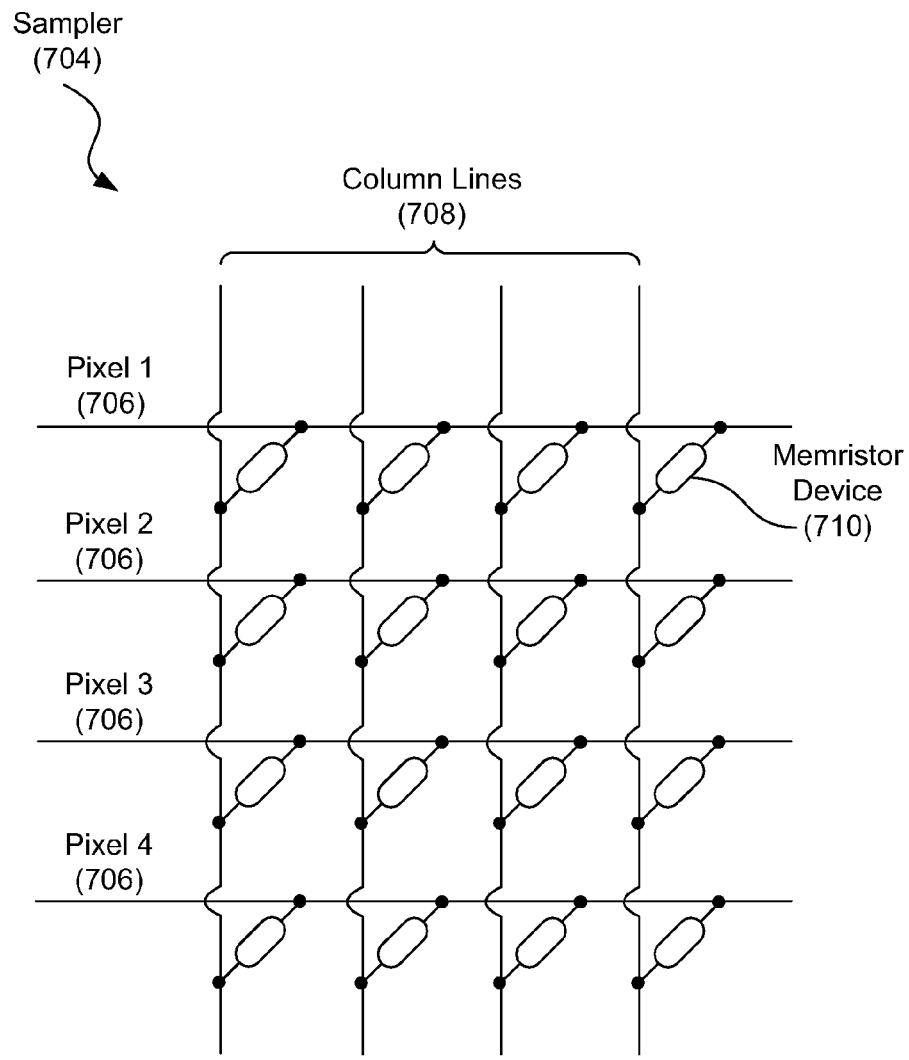

FIGS. 7A and 7B are diagrams showing an illustrative sampling system (700). According to certain illustrative examples, a high speed non-volatile sampler embodying principles described herein is used in conjunction with a pixel sensor for a camera. The camera may be either a photo camera or a video camera. FIG. 7A shows the relation between the pixel sensor array (702) and the high speed non-volatile sampler (704). The pixel sensor array (702) senses light and sends an analog representation of the sensed light to the high speed non-volatile sampler (704).

FIG. 7B is a diagram illustrating a high speed non-volatile sampler (704) in which each row line is connected to one pixel (706) of the pixel sensor array (702). Thus each row can store, in a non-volatile manner, the signal received from a particular pixel (706) of the pixel sensor array (702). If storing an analog representation of the received signal, the memristive devices (710) along a particular row line can store different samples of the input signal which were received at different sampling instants. As mentioned above, this is done by applying bias voltages to the column lines at different instances in time.

Figure 8:
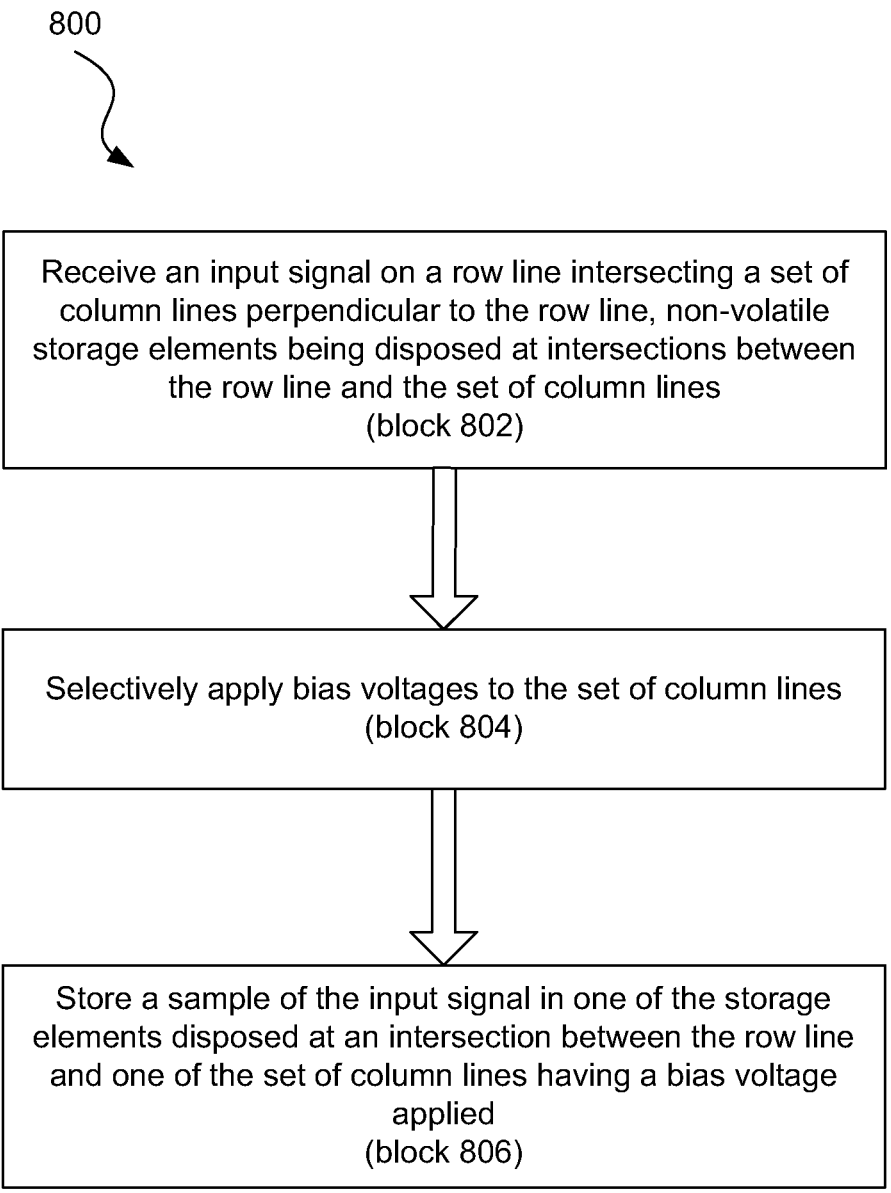
FIG. 8 is a flowchart of a method for storing data on a high speed non-volatile memory device, according to one example of principles described herein.

FIG. 8 is a flowchart of a method for storing data on a high speed non-volatile memory device. According to certain illustrative examples, the method includes receiving (block 802) an input signal on a row line intersecting a set of column lines perpendicular to the row line, non-volatile storage elements being disposed at intersections between the row line and the set of column lines; selectively applying (block 804) bias voltages to the set of column lines; and storing (block 806) a sample of the input signal in one of the storage elements disposed at an intersection between the row line and one of the set of column lines having a bias voltage applied.

In conclusion, through use of a sampling system embodying principles described herein. Sampled data can be stored directly to a non-volatile storage element without the need for an ADC or an additional memory to be used as a buffer. Certain non-volatile storage elements such as memristive devices are able to switch at high speeds, thus a sampling system using such high speed devices can be used to store data which has been sampled at high resolution. Additionally, memristive devices are relatively small. Thus, they can store a high volume of data while using little space.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A non-volatile sampler comprising:
a row line for receiving an input signal to be sampled, said row line intersecting a set of column lines, non-volatile storage elements being disposed at intersections between said row line and said column lines; and
a bias voltage source connected to said set of column lines, said bias voltage source for selectively applying bias voltages to said nonvolatile storage elements to cause said non-volatile storage elements along said row line to store a digitized representation of said input signal.

2. The sampler of claim 1, in which application of said bias voltage to one of said column lines is time-multiplexed, causing non-volatile storage elements along said row line to store samples of said input signal taken at different times.

3. The sampler of claim 1, further comprising a number of additional row lines intersecting said column lines.

4. The sampler of claim 3, further comprising a multiplexer to switch said input signal between said row line and said number of additional row lines.

5. The sampler of claim 1, in which different bias voltages are applied to different column lines from said column lines, each of said bias voltages determining a different bit of said digitized representation to be stored in one of said non-volatile storage elements having that bias voltage applied.

6. The sampler of claim 1, in which said input signal is received from a pixel sensor.

7. The sampler of claim 1, in which said non-volatile storage elements are memristive devices.

8. The sampler of claim 1, in which said row line for receiving said input signal intersects at least one column line with said bias voltage applied, said sample of said input signal being stored on a non-volatile storage element disposed at an intersection between said row line and said at least one column line, in which said input signal is a time-varying sensed signal and said bias voltage has a predetermined magnitude.

9. The sampler of claim 8, in which:
said bias voltage applied to said at least one column line is less than a programming voltage of said non-volatile storage elements;
said time-varying sensed signal applied to said row line is less than a programming voltage of said non-volatile storage elements; and
when a difference of the bias voltage and time-varying sensed signal is greater than said programming voltage then a sample of said time-varying sensed signal is stored on said non-volatile storage element disposed at said intersection between said row line and said at least one column line.

10. The sampler of claim 1, in which said bias voltage and said signal voltage have the same electrical polarity.

11. A method for fabricating a non-volatile memory device, the method comprising:
disposing non-volatile storage elements at intersections between a row line and a set of column lines, said row line for receiving an input signal on a row line intersecting a set of column lines perpendicular to said row line, nonvolatile storage elements being disposed at intersections between said row line and said column lines;
connecting bias voltages to said set of column lines, said bias voltages for selectively applying a bias voltage to at least one of said non-volatile storage elements to cause said at least one of said storage elements to store a sample of said input signal at the instance said bias voltage is applied;

using additional non-volatile storage elements along said row line to store a digitized representation of said sample of said input signal.

12. The method of claim 11, in which selectively applying said bias voltage is time-multiplexed, causing non-volatile storage elements along said row line to store samples of said input signal at different instances.

13. The method of claim 11, further comprising receiving said input signal on a number of additional row lines intersecting said column lines.

14. The method of claim 13, further comprising, with a multiplexer, switching said input signal between said row line and said number of additional row lines.

15. The method of claim 11, in which different bias voltages are applied to different column lines from said column lines, each of said bias voltages determining a different bit of said digitized representation to be stored in one of said non-volatile storage elements having that bias voltage applied.

16. The method of claim 11, in which said input signal is received from a pixel sensor.

17. The method of claim 11, in which said non-volatile storage elements are memristive devices.

18. The method of claim 11, in which said sample of said input signal is stored in at least one of said non-volatile storage elements disposed at an intersection between said row line and at least one said column lines that has said bias voltage applied.

19. A non-volatile sampling system comprising:

a sensor which outputs an analog signal;

a row line to receive said analog signal, said row line intersecting a set of column lines perpendicular to said row line, non-volatile storage elements being disposed at intersections between said row line and said column lines;

a bias voltage source connected to said set of column lines, said bias voltage source for selectively applying a bias voltage to at least one of said nonvolatile storage elements to cause said at least one of said storage elements to store a sample of said analog signal at the instance said bias voltage is applied.

20. The system of claim 19, in which said analog signal is stored in said one of said non-volatile storage elements as an analog value representing said sample of said analog signal.

* * * * *